(12) United States Patent
Kuwahara et al.

(10) Patent No.: US 10,444,287 B2
(45) Date of Patent: Oct. 15, 2019

(54) ROBOT DEVICE, INSPECTION DEVICE, INSPECTION DEVICE OF GENERATOR, AND INSPECTION METHOD

(71) Applicant: Kabushiki Kaisha Toshiba, Minato-ku (JP)

(72) Inventors: Hiroaki Kuwahara, Yokohama (JP); Hideo Chikaoka, Yokohama (JP); Tomio Iwata, Yokohama (JP); Fujio Terai, Yokohama (JP); Yuuichiro Gunji, Yokohama (JP); Akihiro Matsuzaki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 152 days.

(21) Appl. No.: 15/808,038

(22) Filed: Nov. 9, 2017

(65) Prior Publication Data

US 2018/0128879 A1    May 10, 2018

(30) Foreign Application Priority Data

Nov. 9, 2016 (JP) .................. 2016-219182

(51) Int. Cl.
| | | |
|---|---|---|
| *G01R 31/34* | (2006.01) | |
| *B25J 5/00* | (2006.01) | |
| *H05F 1/00* | (2006.01) | |
| *G01R 31/44* | (2006.01) | |

(52) U.S. Cl.
CPC .............. *G01R 31/34* (2013.01); *B25J 5/005* (2013.01); *G01R 31/44* (2013.01); *H05F 1/00* (2013.01); *Y10S 901/44* (2013.01)

(58) Field of Classification Search
CPC .............. G01R 33/44; B25J 5/005; H05F 1/00
See application file for complete search history.

(56) References Cited

U.S. PATENT DOCUMENTS

| | | | | |
|---|---|---|---|---|
| 7,201,055 B1 * | 4/2007 | Bagley | .................. | G01R 31/34 376/249 |
| 9,148,045 B2 | 9/2015 | Visintin | | |
| 2007/0277629 A1 * | 12/2007 | Bagley | .................. | B62D 63/02 73/865.8 |
| 2009/0301168 A1 * | 12/2009 | Moore | .................... | G01M 7/08 73/12.09 |

* cited by examiner

*Primary Examiner* — Jermele M Hollington
*Assistant Examiner* — Alvaro E Fortich
(74) *Attorney, Agent, or Firm* — Oblon, McClelland, Maier & Neustadt, L.L.P.

(57) ABSTRACT

According to one embodiment, a robot device includes a robot and a station part. The robot is inserted into a gap between an outer peripheral surface of a first part of a first member and a second member surrounding the outer peripheral surface. The first member includes the first part and a second part. A step is formed between the first part and the second part. The station part includes an elevating mechanism. The elevating mechanism lowers the robot onto the outer peripheral surface of the first member on a lower stage side of the step, and raises the robot from the outer peripheral surface.

20 Claims, 7 Drawing Sheets

ROBOT DEVICE, INSPECTION DEVICE, INSPECTION DEVICE OF GENERATOR, AND INSPECTION METHOD

CROSS-REFERENCE TO RELATED APPLICATIONS

This application is based upon and claims the benefit of priority from Japanese Patent Application No. 2016-219182, filed on Nov. 9, 2016; the entire contents of which are incorporated herein by reference.

FIELD

Embodiments described herein relate generally to a robot device, an inspection device, an inspection device of a generator, and an inspection method.

BACKGROUND

For example, an apparatus for inspecting a narrow gap between a rotor and a stator of a generator by a robot is proposed.

BRIEF DESCRIPTION OF THE DRAWINGS

FIG. 3A to FIG. 5B are schematic views showing an operation of the inspection device of the embodiment;

DETAILED DESCRIPTION

According to one embodiment, a robot device includes a robot and a station part. The robot is inserted into a gap between an outer peripheral surface of a first part of a first member and a second member surrounding the outer peripheral surface. The first member includes the first part and a second part. A step is formed between the first part and the second part. The station part includes an elevating mechanism. The elevating mechanism lowers the robot onto the outer peripheral surface of the first member on a lower stage side of the step, and raises the robot from the outer peripheral surface.

Various embodiments will be described hereinafter with reference to the accompanying drawings. In the drawings, similar components are marked with like reference numerals.

An inspection device or a robot device of an embodiment is inserted into a gap between a columnar body as a first member and an outer peripheral body as a second member surrounding the columnar body, and inspects at least the columnar body of the columnar body and the outer peripheral body. In the following, a generator including a rotor as the columnar body and a stator core as the outer peripheral body is described by giving an example as an inspection object of the inspection device.

The inspection device of the embodiment includes a station part and an inspection robot.

Figure 1:
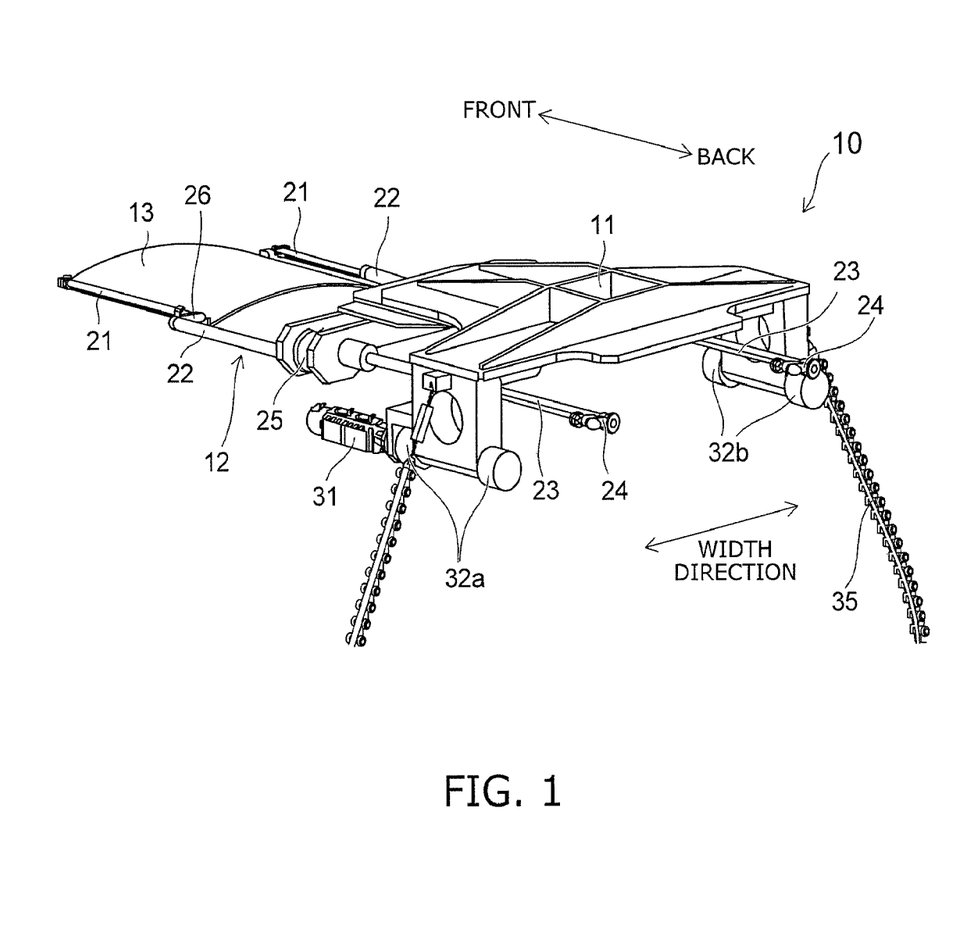
FIG. 1 is a schematic perspective view of a station part in an inspection device of an embodiment.

FIG. 1 is a schematic perspective view of the station part 10 of the inspection device of the embodiment.

Figure 2:
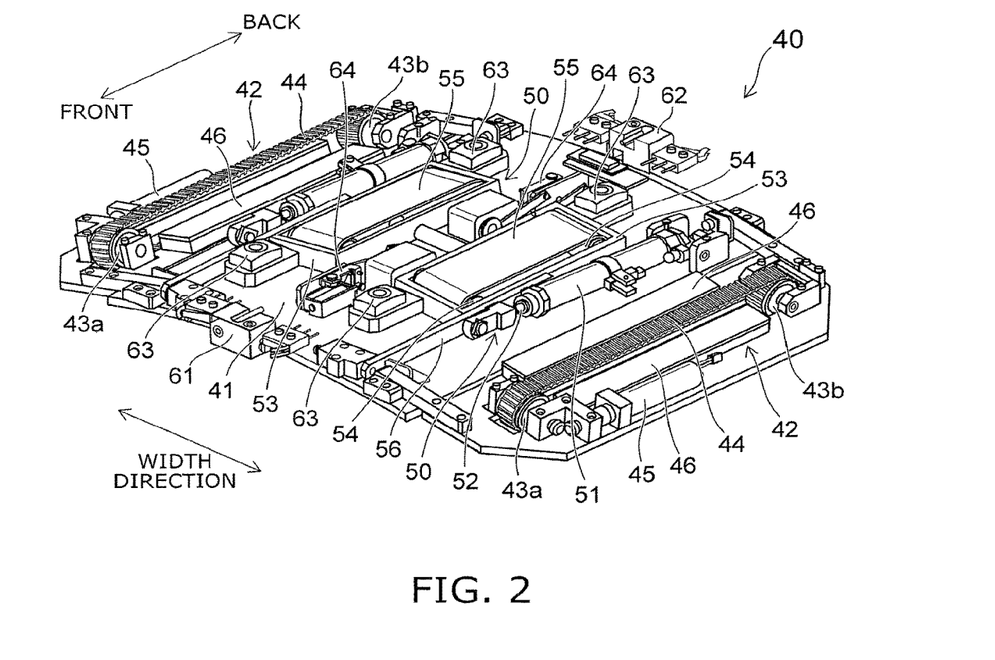
FIG. 2 is a schematic perspective view of an inspection robot in the inspection device of the embodiment.

FIG. 2 is a schematic view of the inspection robot 40 of the inspection device of the embodiment.

As shown in FIG. 1, the station part 10 includes a main body part 11 and an elevating mechanism 12.

The elevating mechanism 12 includes first to third rods 21 to 23, a lever 26, and a stage 13. The first to third rods 21 to 23 and the lever 26 are held on the main body part 11 via a link mechanism 25.

The first to third rods 21 to 23 extend in a front-back direction of the station part 10. The first rod 21 is located on the frontmost side, the third rod 23 is located most backward, and the second rod 22 is connected between the first rod 21 and the third rod 23.

The first rod 21 and the second rod 22 are connected via the lever 26. The second rod 22 and the third rod 23 are connected, for example, via the link mechanism 25 including a gear. An operation part 24 is provided on a rear end of the third rod 23.

The first to third rods 21 to 23, the lever 26, the link mechanism 25, and the operation part 24 are included to constitute one crank unit, and two crank units are provided to be separated in a width direction (a direction orthogonal to the front-back direction) of the station part 10.

Figure 5A:
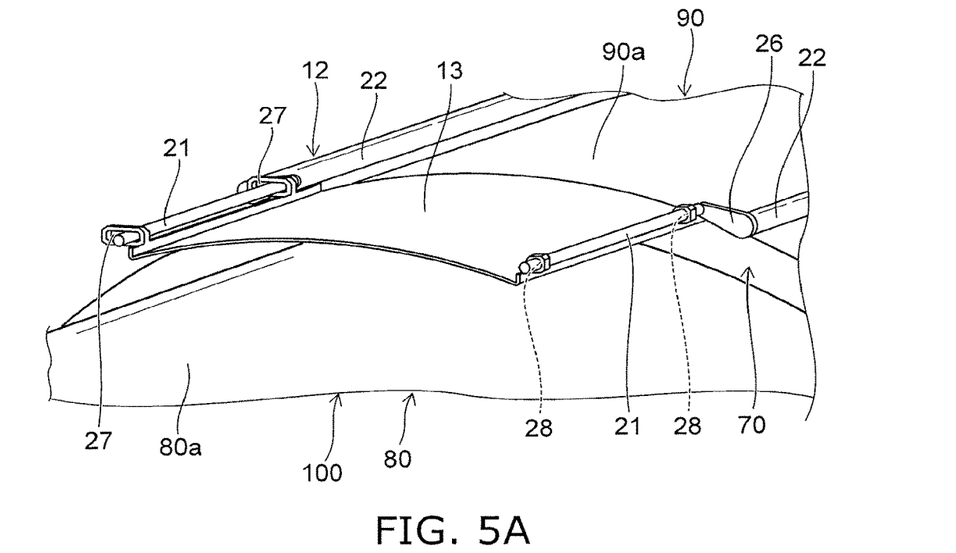
Figure 5B:
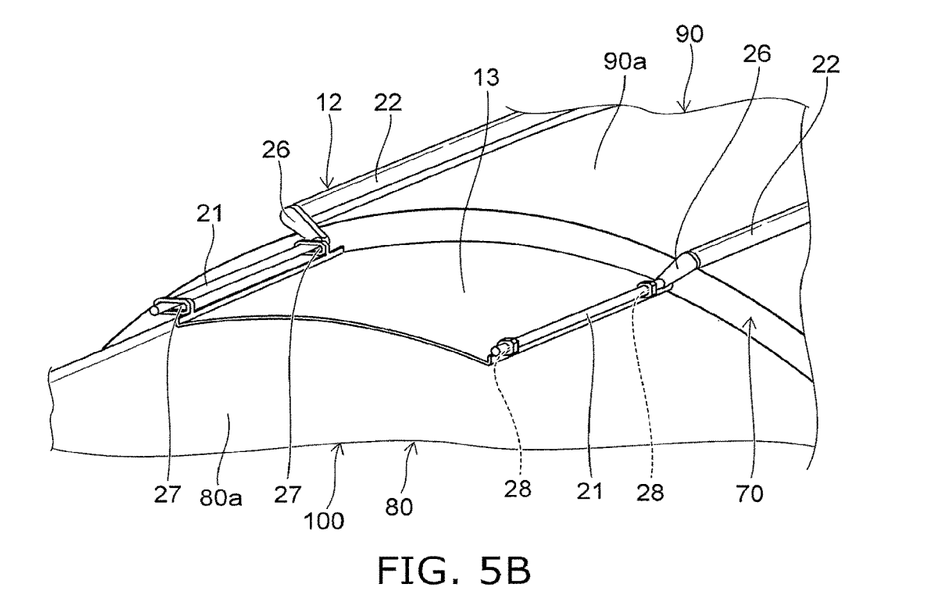

FIG. 5A and FIG. 5B are schematic perspective views showing the operation of the elevating mechanism 12.

Figure 6:
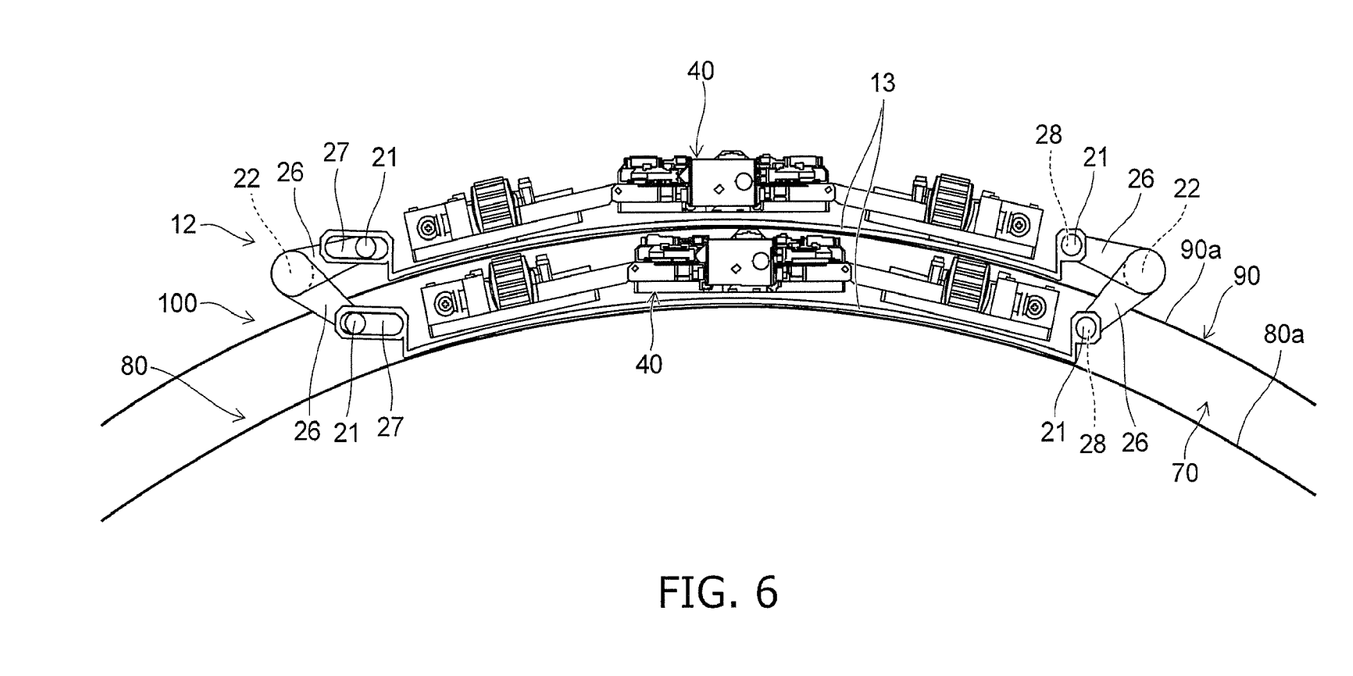
FIG. 6 is a schematic view showing the operation the inspection device of the embodiment.

FIG. 6 is a schematic view of the operation of the elevating mechanism 12 viewed from the front side of the station part 10.

The lever 26 protrudes in a diameter direction of the first rod 21 and the second rod 22. The first rod 21 is fixed on one edge of the lever 26. The second rod 22 is fixed on the other edge of the lever 26, and extends in the front-back direction of the station part 10 in parallel to the first rod 21 at a position shifted from a core of the first rod 21.

The stage 13 is held between a pair of first rods 21 separated in the width direction of the station part 10. The stage 13 is curved along an outer peripheral surface 80a of a rotor body 80 described later.

The stage 13 is connected to the pair of first rods 21 via a first engagement hole 27 and a second engagement hole 28 as shown in FIG. 5A, FIG. 5B and FIG. 6.

One of the first rods 21 of the pair of first rods 21 (left first rod 21 in FIG. 6) is engaged to the first engagement hole 27 provided on one of side edge parts in the stage 13. The first engagement hole 27 is a long hole extending in the width direction of the station part 10. As described later, the first rod 21 is slidable in the first engagement hole 27 with rotational transfer of the first rod 21.

The other first rod 21 (right first rod 21 in FIG. 6) is engaged to the second engagement hole 28 provided on the other side edge part in the stage 13. The first rod 21 is loosely fitted to the circular second engagement hole 28, and is rotatable to the second engagement hole 28.

As shown in FIG. 1, a pair of rollers 32a, 32b separated in the width direction of the station part 10 is provided on the main body part 11 of the station part 10. One rotor 32a is connected to a motor 31. The main body part 11 is connected to a chain belt 35.

The inspection robot 40 shown in FIG. 2 is supported on the stage 13 of the station part 10. The inspection robot 40 includes a base plate 41, a self-travelling mechanism unit 42, an adsorption means 46 and various sensors 61 to 64. The base plate 41 is curved along the outer peripheral surface 80a of the rotor body 80 described later. The adsorption means 46 can be based on, for example, electrostatic adsorption based on electrostatic electricity, and atmospheric adsorption. Here, the inspection robot 40 can transfer on the outer peripheral surface 80a of the rotor body 80 while adsorbing on its surface via the adsorption means 46. The inspection robot 40 transfers or stops on the outer peripheral surface 80a of the rotor body 80 while balancing between the adsorption force of the adsorption means 46 and propulsion force necessary for transfer.

The self-travelling mechanism unit 42 includes a pair of pulleys (roller) 43a, 43b disposed to be separated in the front-back direction of the inspection robot 40, a belt 44 hung over between the pulleys 43a, 43b, and a motor 45. The motor 45 is connected to one pulley 43a. The belt 44 is exposed on a lower surface side of the base plate 41.

The one pair of pulleys 43a, 43b, the belt 44, and the motor 45 constitute the self-travelling mechanism unit 42, and two pairs of self-travelling mechanism units 42 are mounted to be separated in the width direction of the inspection robot 40.

The adsorption means 46 is disposed next to the belt 44. The sensors 61 to 64 are, for example, an electric sensor, an acoustic sensor, a mechanical sensor or the like.

The inspection robot 10 travels on the outer peripheral surface 80a of the rotor body 80 of the generator and inspects the rotor body 80 as described later. Furthermore, the inspection robot 40 inspects a stator core 200 of the generator as well. The sensors 63 and 64 are sensors inspecting the stator core 200 by contact. For example, the sensor 63 is an EL-CID (electro-magnetic core imperfection detector) sensor, and the sensor 64 includes a tapping sound inspection hammer driving part.

A stator core inspection unit 50 including the sensors 63, 64 is mounted on the base plate 41. The stator core inspection unit 50 includes the sensor 63, the sensor 64, an air cylinder 51, an arm 56, and a travelling guide, and for example, two pairs of stator core inspection units 50 are mounted on the base plate 41.

Figure 7:
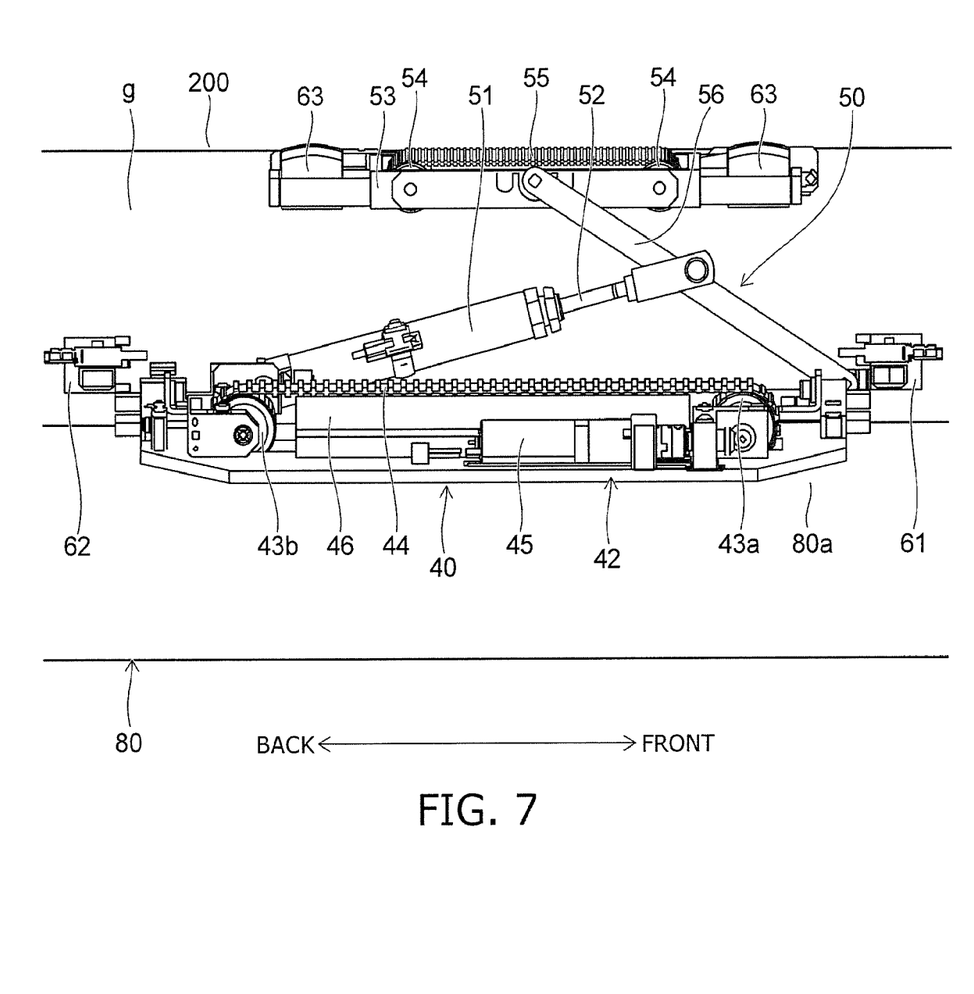
FIG. 7 is a schematic view showing the operation the inspection device of the embodiment.

The arm 56 is connected to a driving rod 52 of the air cylinder 51. As shown in FIG. 7, if the driving rod 52 extends due to driving of the air cylinder 51, one edge of the arm 56 moves up and down around the other edge as a supporting point.

A holding part 53 is attached to the one edge of the arm 56. The sensors 63, 64 are held on the holding part 53. The travelling guide is further held on the holding part 53. The travelling guide includes one pair of guide rollers 54 disposed to be separated in the front-back direction of the inspection robot 40 and a belt 55 hung over between the guide rollers 54.

An air pipe not shown is connected to the air cylinder 51. An electric cable not shown is connected to the motor 45. Or, a battery may be mounted on the base plate 41 and the motor 45 may be driven by the battery.

Next, the operation of the inspection device of the embodiment is described with reference to FIG. 3A to FIG. 6.

Figure 3A:
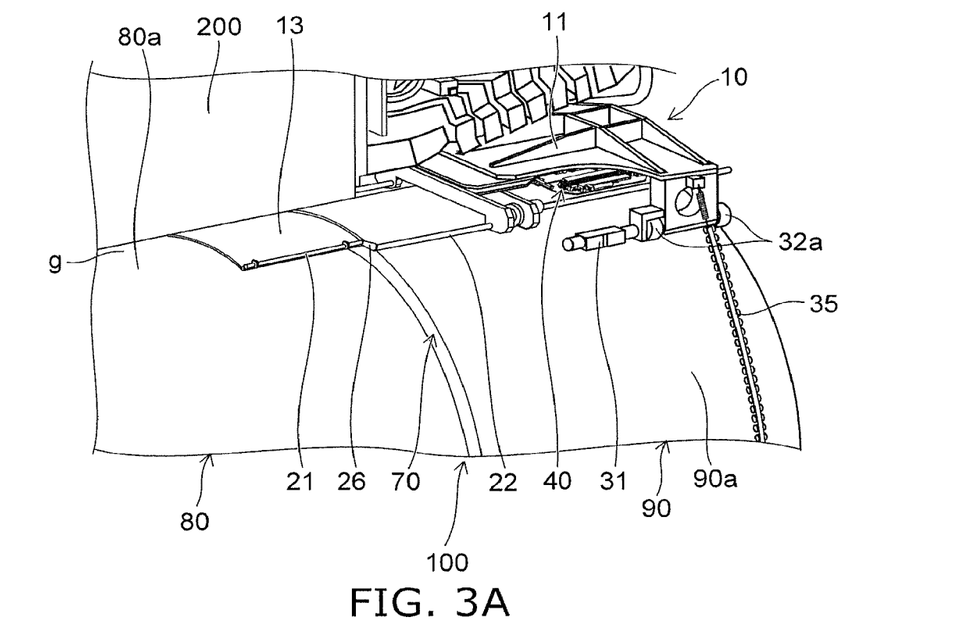

As shown in FIG. 3A, the generator to be inspected includes a rotor 100 as a columnar body and the stator core 200 as an outer peripheral body. FIG. 3A to FIG. 4B show a cross section of the stator core 200.

The rotor 100 includes the rotor body 80 and an end ring 90, a step 70 is formed between the rotor body 80 and the end ring 90, and the end ring 90 is provided on an axial end of the rotor body 80. The outer peripheral surface 80a of the rotor body 80 and an outer peripheral surface 90a of the end ring 90 form the step 70 and are provided to be arranged in the axial direction of the rotor body 80. A height of the step 70 is, for example, about 60 mm.

An outer diameter of the end ring 90 is larger than an outer diameter of the rotor body 80, the outer peripheral surface 90a of the end ring 90 is located on an upper stage side of the step 70 described above, and the outer peripheral surface 80a of the rotor body 80 is located on a lower stage side of the step 70 described above.

The stator core 200 surrounds the outer peripheral surface 80a of the rotor body 80. A gap (narrow space) g is formed between the outer peripheral surface 80a of the rotor body 80 and an inner peripheral surface of the stator core 200. The size of the gap g is, for example, about 100 mm.

As shown in FIG. 3A, the chain belt 35 is wound around the outer peripheral surface 90a of the end ring 90, and the station part 10 is attached on the outer peripheral surface 90a of the end ring 90. The rollers 32a, 32b of the station part 10 contact the outer peripheral surface 90a of the end ring 90. The station part 10 is set on the outer peripheral surface 90a of the end ring 90 so that the extension direction of the first to third rods 21 to 23 are parallel to the axial direction of the rotor body 80.

The stage 13 located on the front side of the station part 10 is inserted into the gap g between the outer peripheral surface 80a of the rotor body 80 and the stator core 200. The upper surface of the stage 13 is substantially at the same height as the outer peripheral surface 90a of the end ring 90, and is aligned in the axial direction of the rotor body 80 across a slight gap to the outer peripheral surface 90a of the end ring 90.

The inspection robot 40 is positioned on the outer peripheral surface 90a of the end ring 90 below the main body part 11 of the station part 10, and the inspection robot 40 is caused to travel toward the stage 13.

Figure 3B:
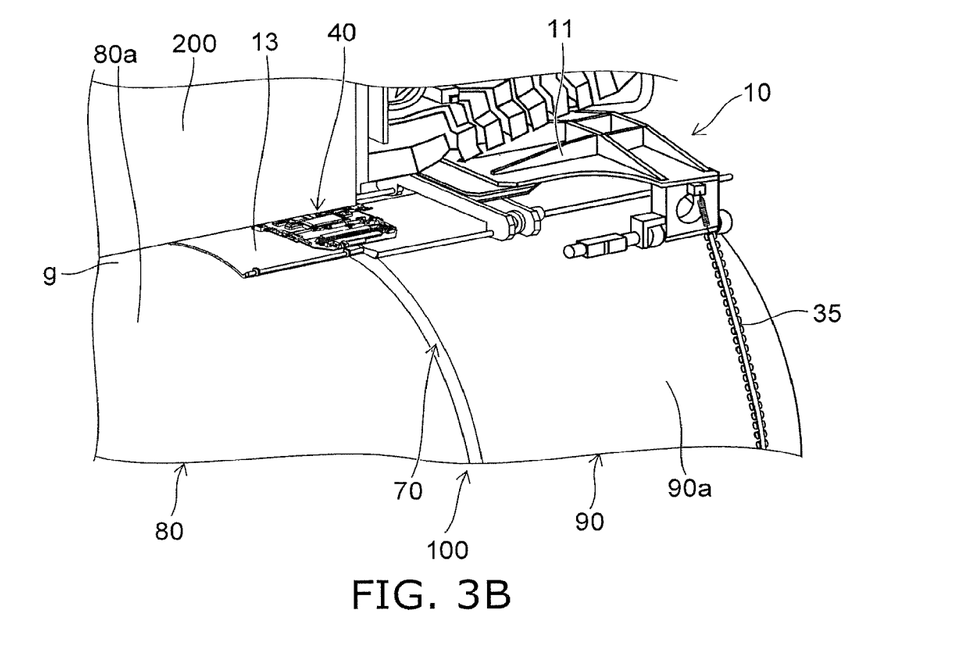
Figure 4A:
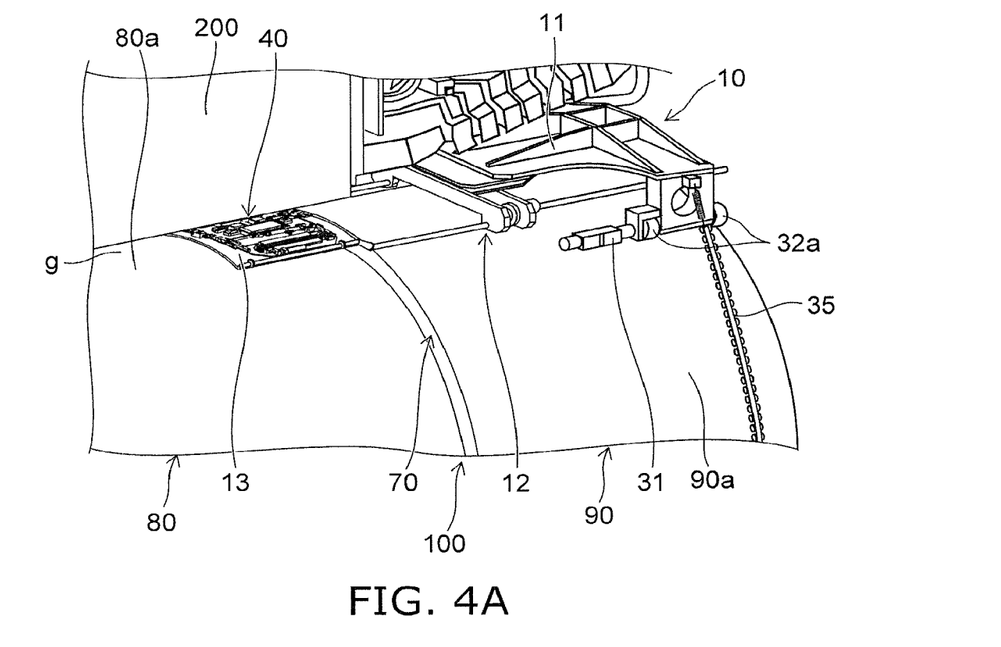

The motor 45 of the inspection robot 40 shown in FIG. 2 is driven. The pulley 43a is rotated due to driving of the motor 45, and the belt 44 is driven. The inspection robot 40 travels toward the front stage 13 on the outer peripheral surface 90a of the end ring 90 by contact of the rotating pulleys 43a, 43b to the outer peripheral surface 90a of the end ring 90 via the belt 44. As shown in FIG. 3B, the inspection robot 40 transfers from the end ring 90 onto the stage 13, and stops on the stage 13 as shown in FIG. 4A.

A large step and a large gap that disturb the transfer of the inspection robot 40 are not formed between the upper surface of the stage 13 and the outer peripheral surface 90a of the end ring 90.

The stage 13 is a magnetic substance, and the inspection robot 40 is adsorbed and held on the stage 13 by the adsorption means 46.

After the inspection robot 40 transfers onto the stage 13, the stage 13 is caused to descend onto the outer peripheral surface 80a of the rotor body 80 by the elevating mechanism 12 described above.

FIG. 5A is a perspective view of a state in which the stage 13 is located at an upper position where the stage 13 is raised from the outer peripheral surface 80a of the rotor body 80. FIG. 5B is a perspective view of a state in which the stage 13 is located at a lower position where the stage descends to the outer peripheral surface 80a of the rotor body 80. In FIG. 5A and FIG. 5B, the inspection robot 40 held on the stage 13 is not shown.

FIG. 6 shows the upper position and the lower position of the stage 13 together.

If the operator turns by hand the operation part 24 shown in FIG. 1, the third rod 23 and the second rod 22 connected to the third rod 23 via the link mechanism 25 rotate around an axis center. The lever 26 swings around its one edge fixing the second rod 22 as a supporting point due to the rotation of the second rod 22 as shown in FIG. 6. The first rod 21 fixed to the other edge of the lever 26 rotates to transfer around the second rod 22.

In FIG. 6, the left side first rod 21 rotates to transfer in clockwise and lowers the height from the upper position to the lower position, and the right side first rod 21 rotates to transfer in counter clockwise and lowers the height from the upper position to the lower position. The stage 13 descends while sliding to the right side by the rotational transfer in counter clockwise of the right side first rod 21. At this time, the first engagement hole 27 as a long hole descends while sliding to the right side relatively to the left side first rod 21.

Figure 4B:
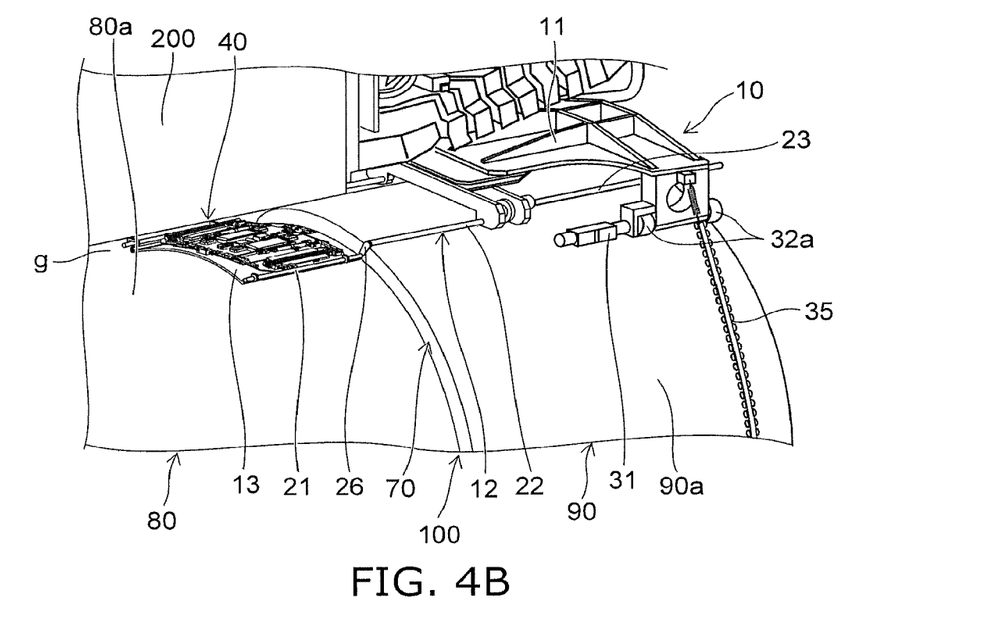

The stage 13 descends from the upper position shown in FIG. 4A to the lower position shown in FIG. 4B, namely, the outer peripheral surface 80a of the rotor body 80 on the lower stage side of the step 70 in a state of holding the inspection robot 40 in the gap g. The inspection robot 40 on the stage 13 does not touch the stator core 200 in a state of the stage being located at the upper position.

The inspection robot 40 is caused to travel and transfer from on the stage 13 to the outer peripheral surface 80a of the rotor body 80 by the self-travelling mechanism unit 42 described above, and is caused to further travel on its outer peripheral surface 80a.

The step between the upper surface of the stage 13 and the outer peripheral surface 80a of the rotor body 80 is smaller than the step 70 between the outer peripheral surface 90a of the end ring 90 and the outer peripheral surface 80a of the rotor body 80, and thus travelling transfer of the inspection robot 40 from the stage 13 to the outer peripheral surface 80a of the rotor body 80 and travelling transfer of the inspection robot 40 from the outer peripheral surface 80a of the rotor body 80 to the stage 13 are not disturbed.

The outer peripheral surface 80a of the rotor body 80 includes a magnetic substance. The inspection robot 40 travels on the outer peripheral surface 80a in the axial direction of the rotor body 80 in a state of the inspection robot 40 adsorbing to the outer peripheral surface 80a by the adsorption means 46.

The inspection robot 40 inspects the rotor body 80 by various sensors including the sensors 61, 62 described above while travelling on the outer peripheral surface 80a of the rotor body 80.

Furthermore, as shown in FIG. 7, the arm 56 is raised (extended) toward the stator core 200, the sensors 63, 64 are contacted with the stator core 200, and the stator core 200 is also inspected. Off course, for example, the stator core 200 is imaged by a sensor such as a camera and thus the stator core 200 may be inspected in non-contact.

The inspection robot 40 also inspects the stator core 200 while travelling on the outer peripheral surface 80a of the rotor body 80. At this time, the belt 55 hung over the guide roller 54 held on one end side of the arm 56 contacts the stator core 200, and guides the inspection robot 40 to travel.

The circumferential transfer (shift) of the inspection robot 40 is suppressed by the adsorption by the adsorption means 46 on the rotor body 80 side and the guide of the guide roller 54 and the belt 55 on the stator core 200 side, and the travelling attitude is kept stable.

In the case where a baffle (protrusion) is provided on the inner peripheral surface of the stator core 200, for example, interference between the stator core inspection unit 50 and the baffle is avoided by lowering the arm 56 downward. The arm 56 is moved up and down by driving the air cylinder 51.

When the inspection of a certain region along the axial direction of the rotor body 80 and the stator core 200 is finished, as shown in FIG. 4B, the inspection robot 40 comes back onto the stage 13 of the station part 10. The stage 13 is raised from the outer peripheral surface 80a of the rotor body 80 by the elevating mechanism 12 described above, and as shown in FIG. 4A, the height of the stage 13 is increased to generally the same height as the outer peripheral surface 90a of the end ring 90.

The first rod 21 and the second rod 22 are rotated in a direction reverse to the direction of descending of the stage 13. In FIG. 6, the left side first rod 21 rotates to transfer in counter clockwise and increases the height from the lower position to the upper position, and the right side first rod 21 rotates to transfer in clockwise and increases the height from the lower position to the upper position. The stage 13 rises while sliding to the left side by the rotational transfer in clockwise of the right side first rod 21, and the first engagement hole 27 as a long hole descends while sliding to the left side relatively to the left side first rod 21 rotating to transfer in counter clockwise.

The stage 13 is raised from the lower position shown in FIG. 4B to the upper position shown in FIG. 4A, namely, the height of the step 70 on the upper stage side in a state of holding the inspection robot 40 in the gap g.

A suction force by the adsorption means 46 is acting between the inspection robot 40 located on the lower position and the outer peripheral surface 80a of the rotor body 80. The elevating mechanism 12 raises the stage 13 and the inspection robot 40 against the suction force.

As shown in FIG. 4A, in a state in which the inspection robot 40 is held on the stage 13 located on the upper position, the station part 10 is caused to transfer in a circumferential direction of the end ring 90, and another region along a circumferential direction of the rotor body 80 and the stator core 200 is inspected.

The station part 10 and the chain belt 35 are sent in the circumferential direction by driving the roller 32a by driving of the motor 31. The inspection robot 40 held on the stage 13 is also transferred in the circumferential direction of the outer peripheral surface 80a above the outer peripheral surface 80a of the rotor body 80 in the gap g.

Similarly to the operation described above, the stage 13 is descended on the outer peripheral surface 80a of the rotor body 80, the inspection robot 40 is caused to travel on the outer peripheral surface 80a of the rotor body 80, and the rotor 80 and the stator core 200 are inspected.

Hereafter, by repeating the operation changing the region to be inspected by transferring the station part 10 in the circumferential direction and travelling inspection of the inspection robot 40, all regions of the rotor body 80 and the stator core 200 in the circumferential direction can be inspected.

According to the embodiment described above, the rotor body 80 and the stator core 200 can be automatically inspected by the inspection robot 40 travelling in the gap g between the rotor body 80 and stator core 200 without extracting the rotor 100 of the generator from the stator core 200.

Furthermore, since the station part 10 of the inspection device includes the elevating mechanism 12, it is possible to input the inspection robot 40 onto the outer peripheral surface 80a of the rotor body 80 across the step 70 between the rotor body 80 and the end ring 90, and it is possible to raise the inspection robot 40 from the outer peripheral surface 80a of the rotor body 80 and collect the inspection robot 40 outside the gap g.

The elevating mechanism is not limited to the configuration described above. For example, the elevating mechanism may be the configuration including a parallel link, a lift or the like.

The rotation of the first to third rods 21 to 23 may be driven by the motor instead of manual driving. It is also possible that the mechanism causing to transfer the stage 13 in the front-back direction is provided and the inspection robot 40 held on the stage 13 above the outer peripheral surface 90a of the end ring 90 is inserted into the gap g by transferring the stage 13 forward.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A robot device comprising:
  a robot inserted into a gap between an outer peripheral surface of a first part of a first member and a second member surrounding the outer peripheral surface, the first member including the first part and a second part, a step being formed between the first part and the second part; and
  a station part including an elevating mechanism, the elevating mechanism lowering the robot onto the outer peripheral surface of the first member on a lower stage side of the step, and raising the robot from the outer peripheral surface.

2. The device according to claim 1, wherein the elevating mechanism includes
  a lever,
  a first rod fixed to one edge of the lever and extending in a first direction,
  a second rod connected to one other edge of the lever and extending in the first direction at a position shifted from a core of the first rod, and
  a stage connected to the first rod and supporting the robot, the stage ascending and descending in conjunction with rotation of the second rod.

3. The device according to claim 1, wherein the robot includes an adsorption part adsorbing on the outer peripheral surface of the first part.

4. An inspection device comprising:
  an inspection robot inserted into a gap between an outer peripheral surface of a columnar part of a columnar body and an outer peripheral body surrounding the outer peripheral surface, the columnar body including the columnar part and a part, the columnar part and the part arranged in an axial direction of the columnar part with a step between the columnar part and the part; and
  a station part including an elevating mechanism and attached to the part, the elevating mechanism lowering the inspection robot onto the outer peripheral surface of the columnar part on a lower stage side of the step, and raising the inspection robot from the outer peripheral surface.

5. The device according to claim 4, wherein the elevating mechanism includes
  a lever,
  a first rod fixed to one edge of the lever and extending in the axial direction of the columnar part,
  a second rod fixed to one other edge of the lever and extending in the axial direction of the columnar part at a position shifted from a core of the first rod, and
  a stage connected to the first rod and supporting the inspection robot, the stage ascending and descending in conjunction with rotation of the second rod.

6. The device according to claim 4, wherein the inspection robot travels on the outer peripheral surface of the columnar part in the axial direction of the columnar part.

7. The device according to claim 4, wherein the inspection robot includes an adsorption part adsorbing on the outer peripheral surface of the columnar part.

8. The device according to claim 4, wherein the inspection robot includes
  an arm extending toward the outer peripheral body, and
  a sensor held on the arm and contacting the outer peripheral body.

9. The device according to claim 4, wherein the station part is transferable in a circumferential direction of the part.

10. The device according to claim 5, wherein the stage is curved along the outer peripheral surface of the columnar part.

11. The device according to claim 4, wherein the inspection robot includes a base plate curved along the outer peripheral surface of the columnar part.

12. An inspection device of a generator comprising:
  an inspection robot inserted in a gap between an outer peripheral surface of a rotor body of a rotor and a stator core surrounding the outer peripheral surface, the rotor including the rotor body and a part, the part provided on an edge in an axial direction of the rotor body with a step between the rotor body and the part; and
  a station part including an elevating mechanism and attached to the part, the elevating mechanism lowering the inspection robot onto the outer peripheral surface of the rotor body on a lower stage side of the step, and raising the inspection robot from the outer peripheral surface.

13. The device according to claim 12, wherein the elevating mechanism includes
  a lever,
  a first rod fixed to one edge of the lever and extending in the axial direction of the rotor body,
  a second rod fixed to one other edge of the lever and extending in the axial direction of the rotor body at a position shifted from a core of the first rod, and
  a stage connected to the first rod and supporting the inspection robot, the stage ascending and descending in conjunction with rotation of the second rod.

14. The device according to claim 12, wherein the inspection robot travels on the outer peripheral surface of the rotor body in the axial direction of the rotor body.

15. The device according to claim 12, wherein the inspection robot includes an adsorption part adsorbing on the outer peripheral surface of the rotor body.

16. The device according to claim 12, wherein the inspection robot includes
  an arm extending toward the stator core, and
  a sensor held on the arm and contacting the stator core.

17. The device according to claim 12, wherein the station part is transferable in a circumferential direction of the part.

18. The device according to claim 13, wherein the stage is curved along the outer peripheral surface of the rotor body.

19. The device according to claim 12, wherein the inspection robot includes a base plate curved along the outer peripheral surface of the rotor body.

20. An inspection method comprising:

attaching a station part to a part of a columnar body including a columnar part and the part, the columnar part and the part being arranged in an axial direction of the columnar part with a step between the columnar part and the part;

lowering an inspection robot held on the station part onto an outer peripheral surface on a lower stage side of the step by driving the station part in a gap between the outer peripheral surface of the columnar part and an outer peripheral body surrounding the outer peripheral surface;

inspecting at least the columnar part of the columnar part and the outer peripheral body by the inspection robot; and raising the inspection robot from the outer peripheral surface by driving the station part.

\* \* \* \* \*